United States Patent [19]

Adlerstein et al.

[11] 4,142,893

[45] Mar. 6, 1979

[54] SPRAY ETCH DICING METHOD

[75] Inventors: Michael G. Adlerstein, Wellesley; Robert L. Sprague, Malden, both of Mass.

[73] Assignee: Raytheon Company, Lexington, Mass.

[21] Appl. No.: 833,316

[22] Filed: Sep. 14, 1977

[51] Int. Cl.² .............................................. G03C 5/00
[52] U.S. Cl. ....................................... 96/36.2; 96/36; 156/634; 156/644; 156/648; 156/649; 156/659; 156/661
[58] Field of Search .................... 96/36, 36.2; 156/634, 156/644, 648, 649, 659, 661

[56] References Cited

U.S. PATENT DOCUMENTS

| | | | |
|---|---|---|---|
| 3,288,662 | 11/1966 | Weisberg | 156/649 |
| 3,632,462 | 1/1972 | Barrington | 156/649 X |
| 3,654,000 | 4/1972 | Totah et al. | 156/649 X |
| 3,746,587 | 7/1973 | Rosvold | 156/649 X |
| 3,775,200 | 11/1973 | Nobel et al. | 156/649 |
| 3,816,270 | 6/1974 | Kniepkamp | 96/36.2 X |
| 3,817,799 | 6/1974 | Schutze et al. | 156/649 |
| 3,887,421 | 6/1975 | Hudson et al. | 156/649 X |
| 3,888,674 | 6/1975 | Nygaard | 96/36 |
| 3,923,975 | 12/1975 | Calviello | 156/649 X |
| 4,029,542 | 6/1977 | Swartz | 156/649 |

*Primary Examiner*—Edward C. Kimlin
*Attorney, Agent, or Firm*—M. D. Bartlett; J. D. Pannone; H. W. Arnold

[57] ABSTRACT

A method is disclosed for dicing individual or groups of diode mesas fabricated upon a single metal heat sink. The undiced device is placed diode mesas down upon a transparent glass plate with the mesas protected in wax. A first mask is positioned upon the opposite side of the plate by alignment with the diode mesas as seen through the plate. Portions of the first mask extend on the plate beyond the edges of the wax and heat sink. A second etching mask is then fabricated upon the bottom of the heat sink by exposing a layer of photoresist through a mask having the same grid pattern as the first mask and which is aligned with the portions of the first mask seen through the glass plate beyond the edge of the heat sink. The diode mesas are etched apart by spraying an appropriate etchant through apertures in the etching mask.

4 Claims, 10 Drawing Figures

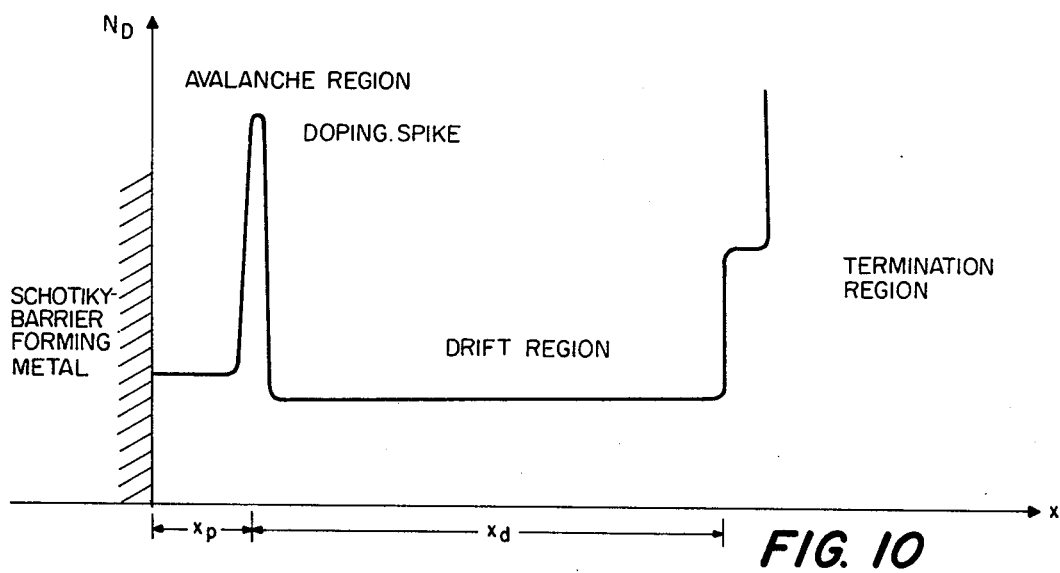
FIG. 10
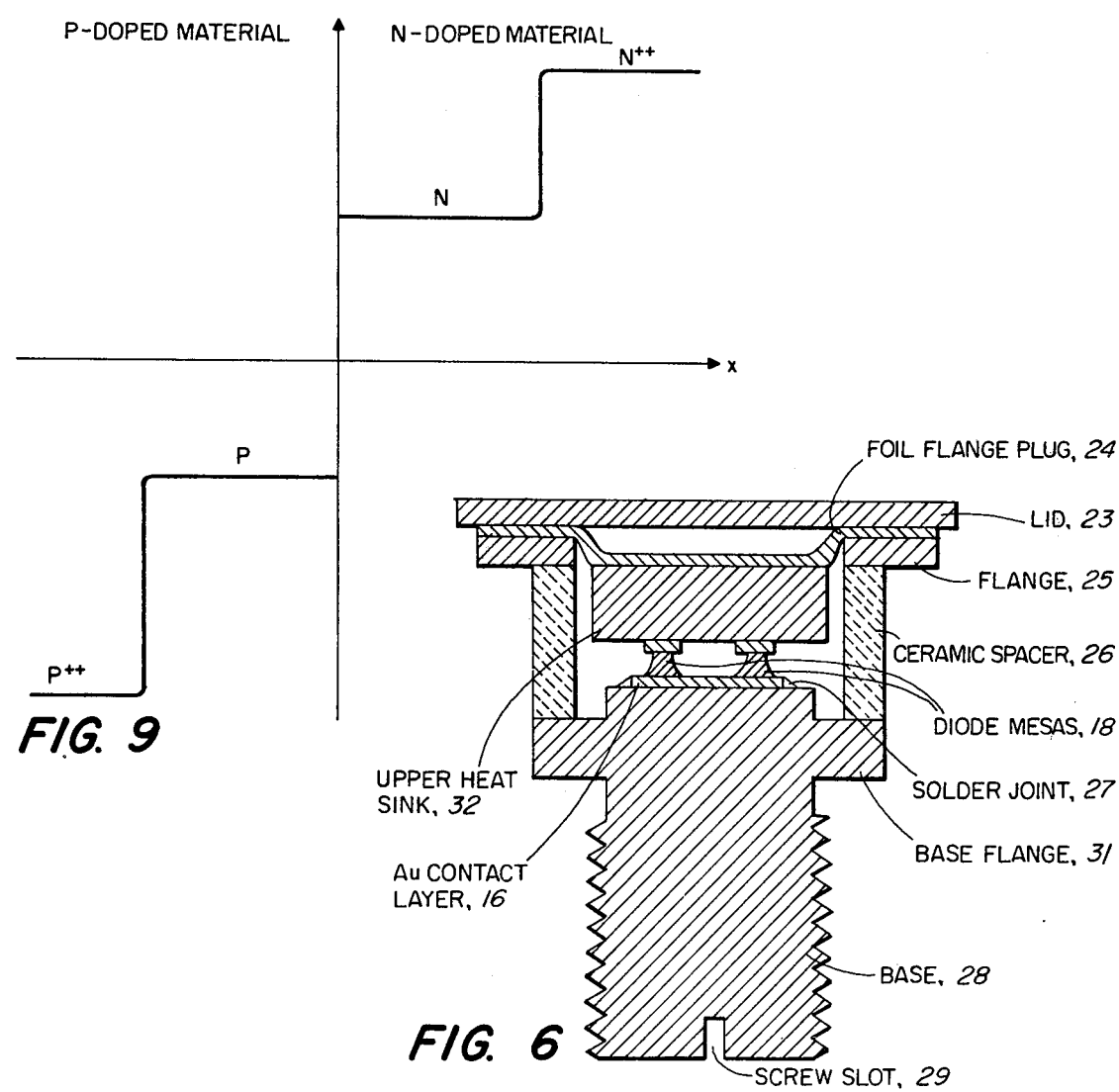
FIG. 9
FIG. 6

SPRAY ETCH DICING METHOD

BACKGROUND OF THE INVENTION

1. Field of the Invention

The invention relates to a method for dicing apart semiconductor devices formed together upon a single underlying heat sink or other metal layer.

2. Description of the Prior Art

Prior to the present invention, knife-blade slicing and laser scribing were the two most widely used techniques for dicing apart semiconductor device mesas formed upon a single underlying heat sink. Both of these suffered from a number of disadvantages. With knife-blade slicing, stress transmitted to the mesa through the heat sink being cut often caused severe degradation in the I-V characteristics of the diode. Deformation of the heat sink also made effective bonding of the semiconductor chip to a second header difficult. Mesas could be broken or chipped due to the stresses produced. Knife-blade slicing was also slow requiring four individual knife cuts per mesa. The effective mesa yield per wafer was reduced since a lower limit had to be put upon the mesa spacing due to the width of the slicing blade. Also, only rectilinear shapes could be produced using knife-blade slicing. Although in many applications circular or other non-rectilinear shapes were desirable to obtain optimum heat flow characteristics, such shapes could not be produced.

With laser scribing, the diodes or other semiconductor devices were subjected often to excessive heating and could be damaged by poorly focussed laser beams or flying debris. Clean-up following the scribing operation was difficult due to burned-on wax and photoresist. As in the case of knife-blade slicing, a practical lower limit to the separation of the mesas was imposed due to limitations in laser beam guidance and focussing. Laser scribing also required complex, expensive and sometimes hazardous equipment. This process was also time consuming, although perhaps not so much as knife-blade slicing. Moreover, laser scribing, as knife-blade slicing, was limited to producing rectilinear shapes.

SUMMARY OF THE INVENTION

Accordingly, it is an object of this present invention to provide a method for dicing apart semiconductor devices such as diodes formed upon a single heat sink without producing damage to the devices during the dicing operation.

It is also an object of the present invention to provide such a method with a reduced lower limit to the separation of the semiconductor devices upon the heat sink.

Also, it is an object of the invention to provide such a dicing method in which bonding of the diced devices to a second header is not made more difficult by the dicing operation.

Moreover, it is an object of the present invention to provide such a dicing method which is both rapid and economical.

Still further, it is an object of the present invention to provide a method for dicing such semiconductor devices into any preferred shape.

These, as well as other objects of the invention, may be met by a method for dicing apart semiconductor device units formed upon a single wafer into any arbitrary two-dimensional shape.

Also, objects of the invention may be met by a method for dicing apart semiconductor device units formed upon a first surface of a metal substrate including the steps of providing masking means upon a second surface of the substrate with apertures along lines where the device units are to be etched apart and etching the substrate through the apertures. The device units may thus be separated individually or in groups. The etching may be accomplished by spraying an etchant fluid into the apertures. The masking means may be constructed by covering at least portions of the second surface of the metal substrate with a layer of photoresistive material, exposing the layer of photoresistive material through an exposure mask aligned in accordance with positions of the semiconductor device units, and developing the layer of photoresistive material to form the apertures through which the dicing lines are formed.

Still further objects of the invention may be met by practicing the method comprising the steps of positioning a device to be etched upon the first surface of a supporting plate, providing first masking means upon a second surface of the plate aligned with predetermined points of the device, providing a second masking means upon at least portions of the device and upon the first surface aligned with predetermined points of the first masking means, and etching portions of the device through apertures in the second masking means. The device to be etched may have a plurality of semiconductor device units disposed upon a layer of metal with predetermined ones of the semiconductor device units being separated from the composite assembled device by etching through a layer of metal joining the various ones of the semiconductor device unit. Each of the semiconductor device units may have a metal contact positioned upon the first surface of the plate. It is with these metal contacts that the first masking means is aligned. The step of etching may comprise etching the layer of metal by spraying an etchant fluid at portions of the device exposed through apertures in the second masking means. The first masking means may comprise any of a number of different types of grid patterns, such as, for example, a photographic film having lines produced thereon. The lines may be either the dark or transparent portion. The lines on the first masking means may or may not be actual apertures through the mask. With the second masking means, however, the lines of the mask defining the lines along which the semiconductor device units are to be etched must actually be apertures. Thus, the first and second masking means do not have to be identical in construction.

The invention may also be practiced by practicing the method of providing a plate of transparent material, providing a composite semiconductor device having a plurality of semiconductor device units disposed upon a first surface of a layer of metal, covering the semiconductor device units with a protective material such as a wax or other pliable non-chemically reactive substance, positioning the composite semiconductor device upon the plate with the semiconductor device units being disposed toward a first surface of the plate, providing first masking means upon a second surface of the plate opposite the semiconductor device with the first masking means aligned in accordance with the positions of the semiconductor device units, and providing second masking means upon the first surface of the plate and at least portions of the layer of metal with the second masking means aligned with the first masking means through the plate of transparent material. Here, semiconductor device unit refers to a body of semiconductor material such as a diode or a transistor chip which may include one or more external contacts but separated from the other semiconductor device units disposed on the same metalization substrate. The first masking means may be provided by covering at least portions of the second surface of the plate with a first layer of photoresistive material, exposing portions of the first layer of photoresistive material through a photographic mask which has been aligned in accordance with the positions of the semiconductor device units, and developing the first layer of photoresistive material to form a first grid pattern upon the second surface of the plate. The second masking means may be provided by performing the steps of covering a second surface of the layer of metal opposite the first surface of the layer of metal and at least a portion of the first surface of the plate with a second layer of photoresistive material, exposing portions of the second layer of photoresistive material through a photographic mask with the photographic mask positioned in accordance with portions of the first grid pattern, and developing the second layer of photoresistive material to form a second grid pattern upon the first surface of the plate and the second surface of the layer of metal. The semiconductor device units may then be separated by spray etching through portions of the layer of metal exposed through the grid pattern in the developed second layer of photoresistive material.

BRIEF DESCRIPTION OF THE DRAWINGS

FIG. 6 is a cross-sectional view from a completed packaged device in accordance with the invention;

FIG. 9 is a graph showing a preferred doping density profile for the semiconductor material used with the invention; and FIG. 10 is a graph showing an alternative preferred doping density profile for the semiconductor material used with the invention.

DESCRIPTION OF THE PREFERRED EMBODIMENTS

Figure 1:
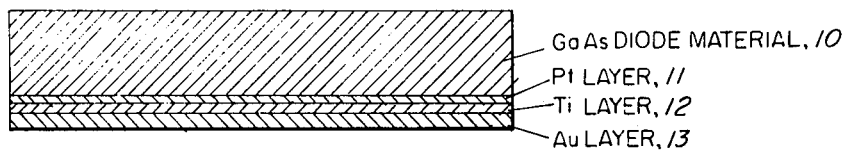
FIGS. 1–4 are a series of cross-sectional views showing steps in the construction of a semiconductor device in accordance with the invention.

Construction of semiconductor devices in accordance with the teachings of the present invention will be initially described in conjunction with the cross-sectional views of FIGS. 1–4. Referring first to FIG. 1, there is shown in cross-section a layer of substrate of gallium arsenide semiconductor diode material 10. Diode material 10 may have one of many different doping density profiles depnding upon the particular application at hand. For example, diode material 10 may have the doping profile of a single-drift region IMPATT avalanche diode. A double-drift region IMPATT avalanche diode doping profile may also be used to particular advantage with the invention.

Referring momentarily to the graph of FIG. 9, the preferred doping profile of the double-drift IMPATT avalanche diode is illustrated. The material is formed in four regions, two of them being doped with an N- or negative-type dopant while the other two are doped with a P- or positive-type dopant. A diode junction is formed substantially at the center of the material between the P and N moderately doped layers. Avalanching of charge carriers takes place on either side of the diode junction within a portion both the P and N layers. The positive and negative charge carriers generated by avalanching are pulled by an electric field outward toward the P++ and N++ heavily doped region producing a time delay between the time of generation of the carriers near the diode junction and the time they reach the heavily-doped region. This time delay corresponds to an 180° phase shift between input and output signals and a diode circuit. The charge carriers in both the P and N regions, upon reaching the P++ and N++ regions respectively, recombine producing a conduction current in the output circuitry. A particular diode device used with the invention which has been found to function well with an N doping density of approximately $1.5 \times 10^{16}/cm^2$, a doping density in the N++ region of $2 \times 10^{18}/cm^3$, a density of $1.3 \times 10^{16}/cm^3$ in the P region and a doping density of approximately $10^{19}/cm^3$ in the P++ region. The N layer may have a width in the range of 3.5 to 4.5 microns depending upon the frequency of operation desired. For the same range of frequencies, the P region may have a width in the range of 3.0 to 3.5 microns. Widths of 5.0 to 8.0 microns for the N++ layer and approximately 1.0 micron for the P++ layer have been found to function adequately.

Most of the heat generated within the material having the doping density profile shown in FIG. 9 is produced in the avalanche regions adjacent the diode junction in the center of the device. The maximum amount of power which can be handled with such a device is, of course, dependent upon the junction temperature. The junction temperature is in turn dependent upon the rate at which heat may be extracted from the device. Since with the double-drift structure it is not possible to place a heat sink immediately adjacent the junction because of the presence of active material extending for appreciable distances on both sides of the junction, heat removal has been a serious problem severely limiting the maximum power at which such devices may be employed.

Referring now to FIG. 10, there is shown a graph of a single-drift Read-type IMPATT diode with which the invention may also be used to advantage. An avalanche region is formed with an N-type semiconductor material adjacent a metal layer suitable for forming a Schottky-barrier junction. A layer of platinum may be used with gallium arsenide semiconductor material to form such a junction. A thin doping spike of heavily doped semiconductor material terminates the avalanche region and confines the avalanche of charge carriers strictly between the layer of Schottky-barrier forming metal and the doping spike. The charge carriers produced within the avalanche region are pulled through the drift region of moderately-doped material by the externally applied electric field. Upon reaching the termination region, the charge carriers recombine forming a conduction current which flows in the external circuitry. A two-layered heavily-doped termination region may be used with the layer immediately adjacent the drift region being less heavily doped to prevent carrier injection from defects at the interface between the drift region and termination region and the consequent generation of an unwanted reverse current. As in the previously described double-drift avalanche diode, heat removal is also a severe problem with this type of device.

Referring again to FIG. 1, the steps in the construction of a device in accordance with the teachings of the present invention will be discussed in further detail. For use with diode material having a doping density in accordance with that specified in FIG. 10, a three-layer metallization pattern is deposited over one surface of diode material 10 with a layer of Schottky-barrier forming metal in contact with the surface of diode material 10. For the case of the double-drift structure shown in FIG. 10, the highly doped P++ layer may be omitted as the three-layer metallization described will form a good ohmic contact with P-type gallium arsenide material. Also, with the double-drift IMPATT avalanche diode specified in FIG. 9, the three-layer metallization may be replaced, for example, by some other metallization system. With the embodiment shown in FIG. 1, first a layer of platinum 11 is sputtered upon the surface of gallium-arsenide diode material 10. Upon platinum layer 11 is then sputtered layer 12. Titanium is the preferred material although tungsten, hafnium, or other refractory metals may be used as well for layer 12. Next, gold layer 13 is sputtered over titanium layer 12. Highly conductive gold layer 13 is sputter deposited upon titanium layer 12 and forms the lower contact to the diode.

In accordance with one aspect of the invention, a particularly advantageous sputtering process is used which results in a device in which the gold layer is prevented from diffusing through the platinum layer into diode material 10 and adversely affecting some of the electrical properties of the material. In accordance with the invention, diode material 10 is first heated to a temperature in the range of 300° to 350° C. with 330° C. being a preferred operating point. Platinum layer 11 is then sputtered upon the surface of diode material 10 with a sputtering power in the range of 0.5 to 2.7 watts/cm$^2$ with a preferred operating point of 0.8 watts/cm$^2$ to a preferred thickness in the range of 100 to 300Å. A thickness of 200Å has been found to function well. During this initial sputtering operation, a portion of platinum layer 11 reacts with the gallium arsenide material forming an alloy therewith. Diode material 10 is then cooled to a temperature in the range of 20° to 40° C. with 30° C. being a preferred operating point, and a layer 12 of titanium having a thickness in the range of 1000Å to 2000Å is sputtered over platinum layer 11 at a relatively high sputtering power level in the preferred range of 1.4 to 4.4 watts/cm$^2$ with a preferred operating point of 2.7 watts/cm$^2$. The relatively high titanium power level causes impact alloying between the remaining platinum and the titanium material forming a compound which reacts chemically much more slowly with gallium arsenide than does pure platinum. Moreover, atoms of gold layer 13 are not able to migrate through the barrier thus formed. Still further, it has unexpectedly been found that diode devices constructed in accordance with the above-described sputtering process exhibit substantially lower noise measures than for diodes having an ordinary Schottky-barrier contact with the gold layer immediately adjacent the Schottky-barrier forming metal.

Figure 2:
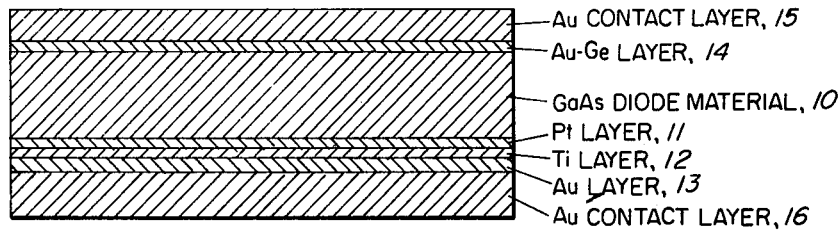

Referring next to FIG. 2, a layer of gold-germanium eutectic alloy is evaporated upon the surface of gallium arsenide diode material 10 opposite that upon which the platinum-titanium-gold layers were deposited. This surface corresponds to the outer side of the termination region of a device having a profile shown in FIG. 10.

Atop gold-germanium layer 14 is plated gold contact layer 15. Similarly, gold contact layer 16 is plated above previously deposited gold layer 13.

Figure 3:
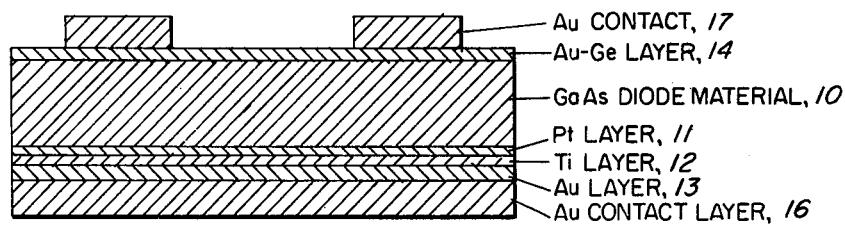

Next, as shown in the view of FIG. 3 gold-contact layer 15 is masked and chemically etched away in predetermined locations using well-known photoresist techniques to leave a plurality of circular gold contacts 17 atop positions at which diode mesas are to be formed. Ordinarily, many more contacts could be formed upon a single semiconductor wafer than are herein shown. For large-scale production, many hundreds of such contacts could be formed upon one wafer then the diode mesa devices diced apart singly or in groups as desired.

Figure 4:
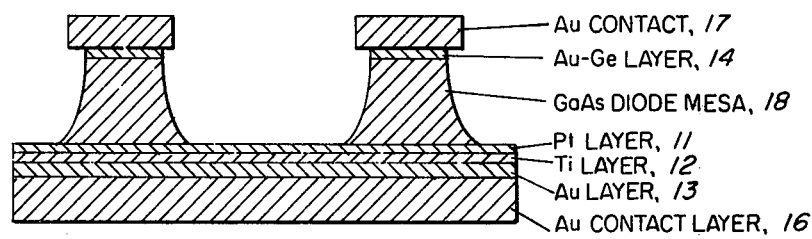

Next, as illustrated in the view of FIG. 4, gold-germanium layer 14 and portions of diode material 10 are chemically etched away between gold contacts 17 to form individual diode mesas 18. A top view of the device at this stage of fabrication is shown in the view of FIG. 5.

Figure 5:
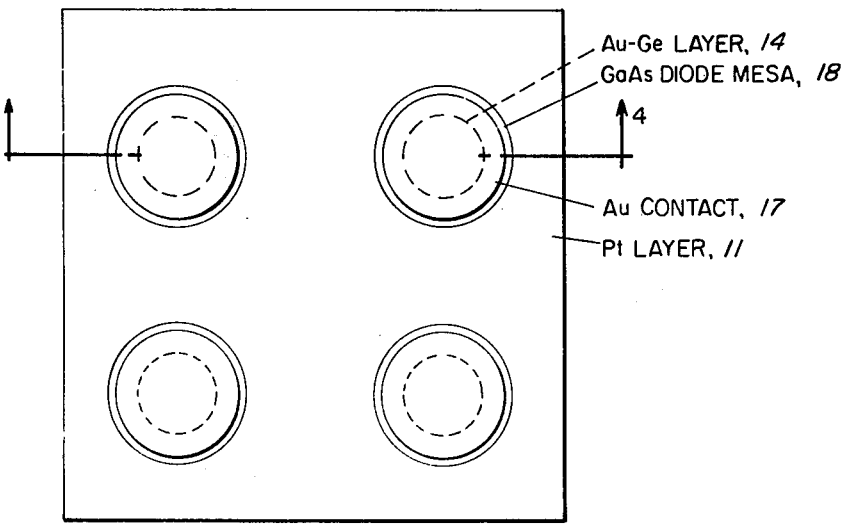
FIG. 5 is a top view of the device as shown in FIG. 4.

Referring next to the cross-sectional view of FIG. 6, there is shown the four-mesa device of FIGS. 4 and 5 assembled in a double-heat sink microwave diode package in accordance with the invention. Gold-contact layer 16 is soldered to the upper surface of metallic diode base 28 with solder joint 27. Diode base 28 is preferably a highly thermally and electrically conductive metal such as copper which may have a coating of gold on its outer surface. The lower portion of base 28 is threaded and provided with a screw slot 29 for package mounting.

Base 28 forms a heat sink for the heat produced within diode mesas 18 and transmitted through gold-contact layer 16. Base flange 31 is provided around the upper portions of diode base 28 to form support for cylindrically-shaped ceramic spacer 26. Ceramic spacer 26 is both thermally and electrically insulating. Annularly-shaped flange 25 is secured atop ceramic spacer 26.

In accordance with the invention, upper heat sink 32 is provided within the interior space of ceramic spacer 26 in electrical and thermal contact with gold contacts 17 of diode mesas 18. Upper heat sink 32 is formed of a highly thermally and electrically conductive metal such as gold-plated copper as used for base 28. The volume of upper heat sink 32 should be much larger than that of diode mesas 18 to provide a low thermal resistance for heat flowing out of the upper ends of diode mesas 18. A flexible foil-flanged plug 24, in thermal and electrical contact with the upper surface of upper heat sink 32, is secured to the upper surface of flange 25. A metal lid 23 covers and is also an electrical and thermal contact with foil-flanged plug 24. In actual device operation, such as in an amplifier or oscillator circuit, a contact rod abuts the surface of lid 23 providing continuation of the upper heat path.

The device shown in FIG. 6 has numerous advantages over the devices of prior art in its heat-flow characteristics allowing it to be employed at higher power levels than were heretobefore possible with diode devices of similar dimensions. First, by providing multiple diode mesas, rather than a single mesa of the same total junction area, the thermal resistance between the junction or any point within any one of the diode mesas is substantially lower than for a larger single mesa device. An arrangement of three mesas or other devices in a substantially equilateral triangular arrangement, or four devices in a rectangular arrangement is preferred. Secondly, because heat sinks are provided upon both sides of the diode mesas, heat may flow outwardly from two directions from the heat generating areas within the diode material. In this manner, a second large reduction in overall thermal resistance and hence junction temperature is achieved.

Figure 7:
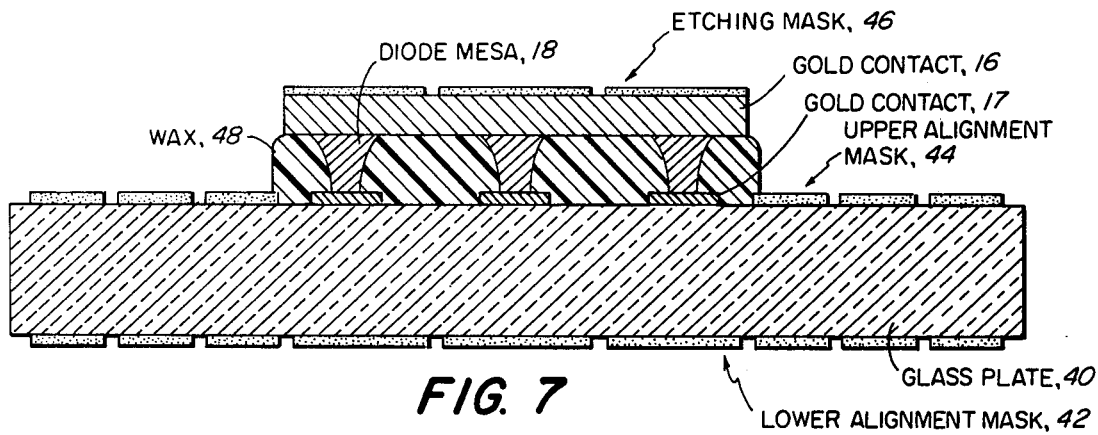
FIG. 7 is a cross-sectional view showing steps in a dicing operation in accordance with the invention.

Referring next to FIG. 7, there is shown a cross-sectional view useful in explaining a dicing procedure in accordance with the invention. A device in the same state of construction as illustrated in FIGS. 4 and 5 is mounted upon transparent glass plate 40 with a non-reactive wax 48 filling the space between and around diode mesas 18 and gold contact 17. The wax protected device is pressed against the upper surface of glass plate 40 with gold contacts abutting the surface. From the lower surface of glass plate 40 it is then possible to visually distinguish between gold contacts 17 and wax 48 lying therebetween hence making it possible to determine where the dicing cuts are to be made.

The lower surface of glass plate 40 is then covered with a transparent layer of photoresist material which is masked with a photographic mask having lines corresponding to the positions of the dicing cuts and exposed to form lower alignment mask 42 having lines corresponding to those along which the dicing cuts are to be made through gold contact layer 16. Other such lines are provided for alignment purposes in a grid pattern beyond the periphery of wax 48.

Next, a second layer of photoresist material is deposited upon the upper surface of glass plate 40 and the upper surface of gold-contact layer 16. The same mask which was used to expose lower alignment mask 42 is aligned visually with the portions of the grid pattern extending beyond the periphery of wax 48. The photoresist layer is then exposed and chemically etched to remove the photoresist material in the lines along which dicing is to be made.

Figure 8:
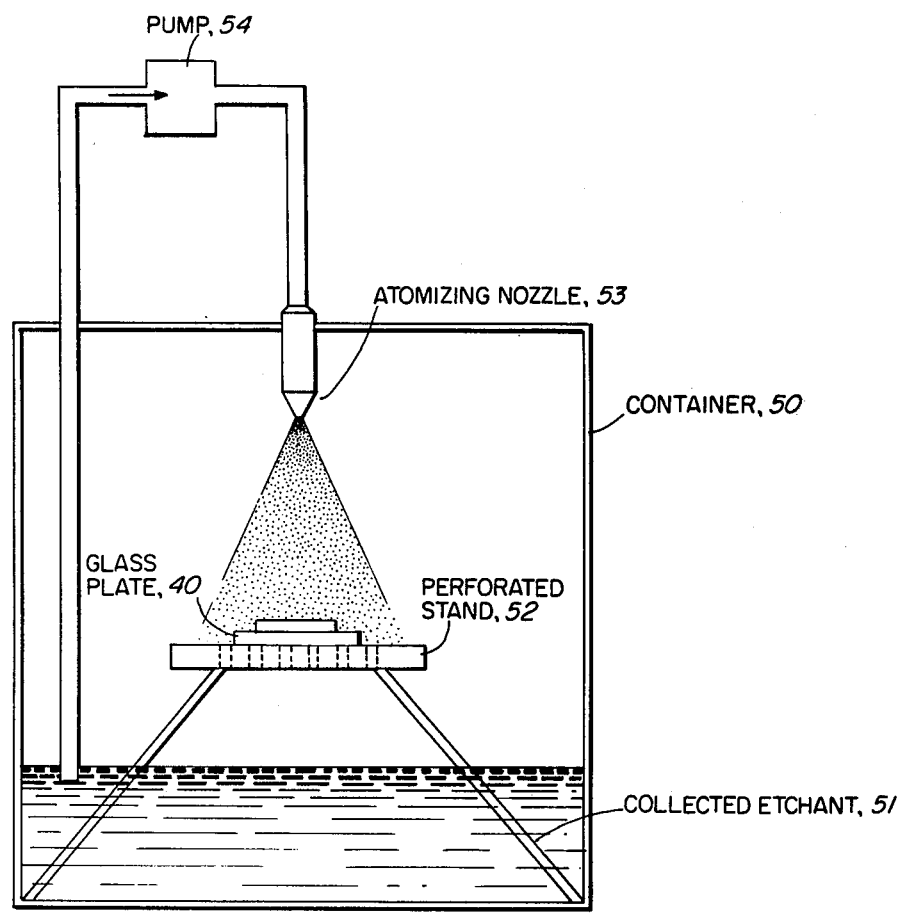
FIG. 8 shows a cross-sectional view of a spray-etching operation as used in the dicing operation of the invention.

The device at the stage of construction as shown in FIG. 7 is then placed within a spray-etching system illustrated in FIG. 8. The device is placed upon perforated stand 52 positioned above a tank of collected etchant 51. Pump 54 circulates the collected etchant 51 through atomizing nozzle 53 spraying it toward the exposed dicing lines. The etching process continues until the desired portions of gold-contact layer 16 have been completely etched through. Wax 48 is then removed allowing the devices to be separated.

Of course, as before, many more than three diode mesas would ordinarily be provided on a wafer that is being diced, three only being shown for clarity of illustration. The same technique may be employed for etching apart single diode mesas or groups of diode mesas. It may also be readily appreciated that any shape heat sink may be produced with the technique of the invention. For example, a circular heat sink may be produced for a device having three mesas positioned in an equilateral triangular arrangement so that each mesa has the same effective thermal resistance. This could not have been done with the rectilinear techniques of the prior art.

This completes the description of the preferred embodiments of the invention. Although preferred embodiments have been described, it is believed that numerous modifications and alterations thereto would be apparent to one having ordinary skill in the art without departing from the spirit and scope of the invention.

What is claimed is:

1. The method comprising the steps of:
   providing a plate of transparent material;
   providing a composite semiconductor device having a plurality of semiconductor device units disposed upon a first surface of a layer of metal;
   covering said semiconductor device units with a protective material;
   positioning said composite semiconductor device upon said plate with said semiconductor device units being disposed toward a first surface of said plate;
   forming a first photoresistive mask utilizing a first masking means upon a second surface of said plate opposite said first surface of said plate, said first masking means being aligned in accordance with the positions of said semiconductor device units; and
   forming a second photoresistive mask upon said first surface of said plate and upon the surface of said layer of metal opposite said semiconductor device units utilizing a second masking means, said second masking means being aligned with said first mask through said transparent plate.

2. The method of claim 1 wherein said steps of forming said first mask comprises:
   covering at least portions of said second surface of said plate with a first layer of photoresistive material;
   exposing portions of said first layer of photoresistive material through a photographic mask, said photographic mask being aligned in accordance with the positions of said semiconductor device units; and
   developing said first layer of photoresistive material to form a first grid pattern upon said second surface of said plate.

3. The method of claim 2 wherein said step of forming said second mask comprises the steps of:
   covering a second surface of said layer of metal opposite said first surface of said layer of metal and at least a portion of said first surface of said plate with a second layer of photoresistive material;
   exposing portions of said second layer of photoresistive material through a photographic mask, said photographic mask being positioned in accordance with portions of said first grid pattern; and
   developing said second layer of photoresistive material to form a second grid pattern upon said first surface of said plate and said second surface of said layer of metal.

4. The method of claim 3 further comprising the step of:
   spray etching through portions of said layer of metal exposed through said grid pattern.

* * * * *